US007271056B2

(12) United States Patent
Su

(10) Patent No.: US 7,271,056 B2
(45) Date of Patent: Sep. 18, 2007

(54) METHOD OF FABRICATING A TRENCH CAPACITOR DRAM DEVICE

(75) Inventor: Yi-Nan Su, Tao-Yuan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/160,853

(22) Filed: Jul. 12, 2005

(65) Prior Publication Data
US 2007/0015327 A1    Jan. 18, 2007

(51) Int. Cl.
*H01L 21/8242* (2006.01)
(52) U.S. Cl. .............. 438/243; 438/386; 257/E21.396
(58) Field of Classification Search ................ 438/343, 438/286, 386–392, 243–249; 257/301, E27.092, 257/E27.095, E29.346, E21.396
See application file for complete search history.

(56) References Cited

U.S. PATENT DOCUMENTS

| 5,111,259 | A | * | 5/1992 | Teng et al. ................. 257/301 |
| 5,466,628 | A | * | 11/1995 | Lee et al. .................... 438/386 |
| 5,470,778 | A | * | 11/1995 | Nagata et al. .............. 438/246 |
| 5,858,857 | A | * | 1/1999 | Ho .............................. 438/424 |
| 5,913,118 | A | * | 6/1999 | Wu ............................. 438/243 |
| 2006/0124982 | A1 | * | 6/2006 | Ho et al. .................... 257/304 |

FOREIGN PATENT DOCUMENTS

JP        8-70108        3/1996

* cited by examiner

*Primary Examiner*—Brook Kebede
(74) *Attorney, Agent, or Firm*—Winston Hsu

(57) ABSTRACT

The present invention discloses a STI-first process for making trench DRAM devices. According to the preferred embodiment, the etching recipe for etching the STI region in the memory array is completely compatible with the logic STI process.

20 Claims, 30 Drawing Sheets

METHOD OF FABRICATING A TRENCH CAPACITOR DRAM DEVICE

BACKGROUND OF THE INVENTION

1. Field of the Invention

The present invention relates to a process of making a semiconductor device. More particularly, the present invention relates to a process of fabricating a deep trench capacitor of a dynamic random access memory (DRAM) device. According to this invention, the shallow trench isolation (STI) regions are fabricated prior to the formation of the deep trench capacitors.

2. Description of the Prior Art

As the size of a memory cell shrinks, the chip area available for a single memory cell becomes very small. This causes reduction in capacitor area and therefore becomes a challenge for chip manufacturers to achieve adequate cell capacitance. Trench-capacitor DRAM devices are known in the art. A trench-storage capacitor typically consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate.

The doped LPCVD polysilicon fill and the buried plate serve as the electrodes of the capacitor, wherein the polysilicon fill is typically referred to as a storage-node electrode. According to the prior art, a dielectric isolation collar disposed at the upper region of the trench is essential for preventing leakage of the signal charge.

Please refer to FIG. 1 to FIG. 11. FIG. 1 to FIG. 11 are schematic cross-sectional diagrams showing the fabrication process of the trench capacitor DRAM according to the prior art. As shown in FIG. 1, firstly, deep trench structures 11 are formed in the semiconductor substrate 10. The formation of deep trenches is known in the art. For example, a hard mask stack consisting of a pad oxide layer 12, a pad nitride layer 14, and a thick borosilicate glass (BSG) layer 16 is formed on a main surface of the semiconductor substrate 10. Thereafter, a conventional lithographic technique and etching process such as reactive ion etching are carried out to form the deep trench structures 11.

As shown in FIG. 2, after removing the remaining BSG layer 16, an arsenic silicate glass (ASG) layer 22 is deposited on the interior surface of the deep trench structures 11. The ASG layer 22 is also deposited on the pad nitride layer 14. A photoresist layer 24 is then formed at the lower portion of each deep trench structure 11. To form the photoresist layer 24, a layer of photoresist is coated on the substrate 10 and fills the deep trench structures 11. The photoresist is then etched back. The ASG layer 22 that is not covered by the photoresist layer 24 is removed from the sidewalls of the deep trench structures 11 and from the surface of the pad nitride layer 14.

As shown in FIG. 3, a thermal process is carried out to drive dopants, in this case, arsenic, from the ASG layer 22 into the adjoining substrate 10, thereby forming a buried N+ diffusion plate 25, which serves as a first electrode of the deep trench capacitor. Thereafter, the photoresist layer 24 and the ASG layer 22 are removed by methods known in the art.

As shown in FIG. 4, a capacitor dielectric layer 27 such as an oxide-nitride (ON) or an oxide-nitride-oxide (ONO) dielectric film is formed on the interior surface of the deep trench structures 11. A first polysilicon layer 29 is then formed in the substrate 10. The first polysilicon stud 29 has a top surface that is much lower than the surface of the substrate 10. To form the first polysilicon stud 29, a layer of CVD polysilicon layer is deposited on the substrate 10 and fills the deep trench structures 11. The CVD polysilicon layer (not shown) is then etched back to form a recess at the upper portion of each deep trench structure 11. This process is also referred to as first poly deposition and recess etching process. The exposed capacitor dielectric layer 27, which is not covered by the first polysilicon stud 29, is then removed.

As shown in FIG. 5, a collar oxide layer 32 is then formed on the upper sidewalls of the deep trench structures 11 above the first polysilicon stud 29. A second poly deposition and recess etching process is carried out to form a second polysilicon stud 34 in the deep trench structure 11 on the first polysilicon stud 29. The formation of the collar oxide is known in the art. For example, a CVD oxide film (not shown) is deposited on the interior surface of the deep trench structure 11. The CVD oxide film is then etched back.

As shown in FIG. 6, the exposed collar oxide layer 32, which is not covered by the second polysilicon stud 34, is removed so as to expose the substrate 10 at the upper portion of the deep trench structure 11 and to form a recess 36 at the top of each deep trench structure 11.

As shown in FIG. 7, a third polysilicon stud 44 is formed in the recess 36. The third polysilicon stud 44, which has a top surface that is lower than the surface of the substrate 10, is formed on the second polysilicon stud 34. A chemical vapor deposition process is performed to deposit a borosilicate glass (BSG) layer 46 on the substrate 10. The BSG layer 46 fills the recess 36.

As shown in FIG. 8, a lithographic process is carried out to form a patterned photoresist layer 48 on the BSG layer 46. The patterned photoresist layer 48 having an opening 50 defines the shallow trench isolation area. The pattern of the photoresist layer 48 is then transferred to the underlying BSG layer 46 and the pad nitride layer 14 using a conventional anisotropic dry etching process.

As shown in FIG. 9, using the remaining photoresist layer 48 and the BSG layer 46 as an etch hard mask, an anisotropic dry etching process is carried out to etch the pad oxide layer 12, the substrate 10, the third polysilicon stud 44, the upper portion of the second polysilicon stud 32, and the upper portion of the collar oxide layer 32 through the opening 50, thereby forming an STI opening 52.

As shown in FIG. 10, after removing the remaining BSG layer 46, The STI opening 52 is filled with a high-density plasma (HDP) oxide film 56. Finally, as shown in FIG. 11, a conventional chemical mechanical polishing (CMP) process is carried out to polish the HDP oxide film 56 to a pre-selected thickness.

In general, the above-described prior art method for fabricating a trench capacitor of a DRAM device can be summarized as follows:

Phase 1: deep trench etching.

Phase 2: buried plate and capacitor dielectric formation.

Phase 3: first polysilicon deep trench fill and first recess etching.

Phase 4: collar oxide formation.

Phase 5: second polysilicon deposition and second recess etching.

Phase 6: third polysilicon deposition and third recess etching.

Phase 7: STI process.

It is disadvantageous to use the above-described prior art method for fabricating a trench capacitor of a DRAM device because the prior art processes are complicated and time-consuming. According to the prior art, it needs three stages of polysilicon deposition (poly 29, 34 and 44) and the subsequent recess etching to complete the capacitor electrode situated within the deep trench. Further, as each capacitor cell area shrinks, the thickness of the collar oxide has negatively affected the effective space for depositing the second polysilicon stud 34, and therefore results in raised capacitor resistance and reduced memory operation performance. In a worst case, the CVD polysilicon cannot be deposited into the deep trench because the thick collar oxide narrows down the dimensions of the upper portion of the deep trench.

Moreover, when defining active areas and shallow trench isolation regions, misalignment might cause capacitor disconnection from the pass transistor/gate thereof because signals cannot be transmitted to the storage node through the collar polysilicon stud 34. Furthermore, it is difficult to develop a suitable etchant recipe for etching the complex structure within the STI regions.

Accordingly, there is a strong need for an improved method for making deep trench capacitors of DRAM devices which is not complicated and has good yield and reliability.

SUMMARY OF THE INVENTION

The primary objective of the present invention is to provide an improved method of manufacturing a trench capacitor DRAM device.

According to the claimed invention, a method of fabricating a trench capacitor dynamic random access memory (DRAM) device is disclosed. A semiconductor substrate having thereon a pad layer is prepared. A first opening is formed in the pad layer. Using the pad layer as an etching hard mask, a dry etching is performed to etch the semiconductor substrate through the first opening to form a first trench. The shallower trench is filled with insulating material to form a first trench isolation (STI) region. A mask layer is formed over the semiconductor substrate. The mask layer has a second opening that exposes a portion of the STI region and a portion of the pad layer. Using the mask layer as an etching hard mask, the exposed STI region and pad layer is etched through the second opening to form a second trench. A trench capacitor is then formed within the second trench. A thermal oxidation process is performed to oxidize a top portion of the trench capacitor, thereby forming an insulating oxide layer. The pad layer is stripped to expose the semiconductor substrate. A gate oxide layer is grown on the exposed the semiconductor substrate. A switch gate is formed on the gate oxide layer, and a pass gate is formed on the insulating oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a process of making deep trench capacitor DRAM devices. The present invention is characterized in that the STI region is fabricated prior to the formation of deep trench capacitors. Further, the etching recipe for etching the STI region 106 in the memory array is completely compatible with logic STI process.

Figure 1:
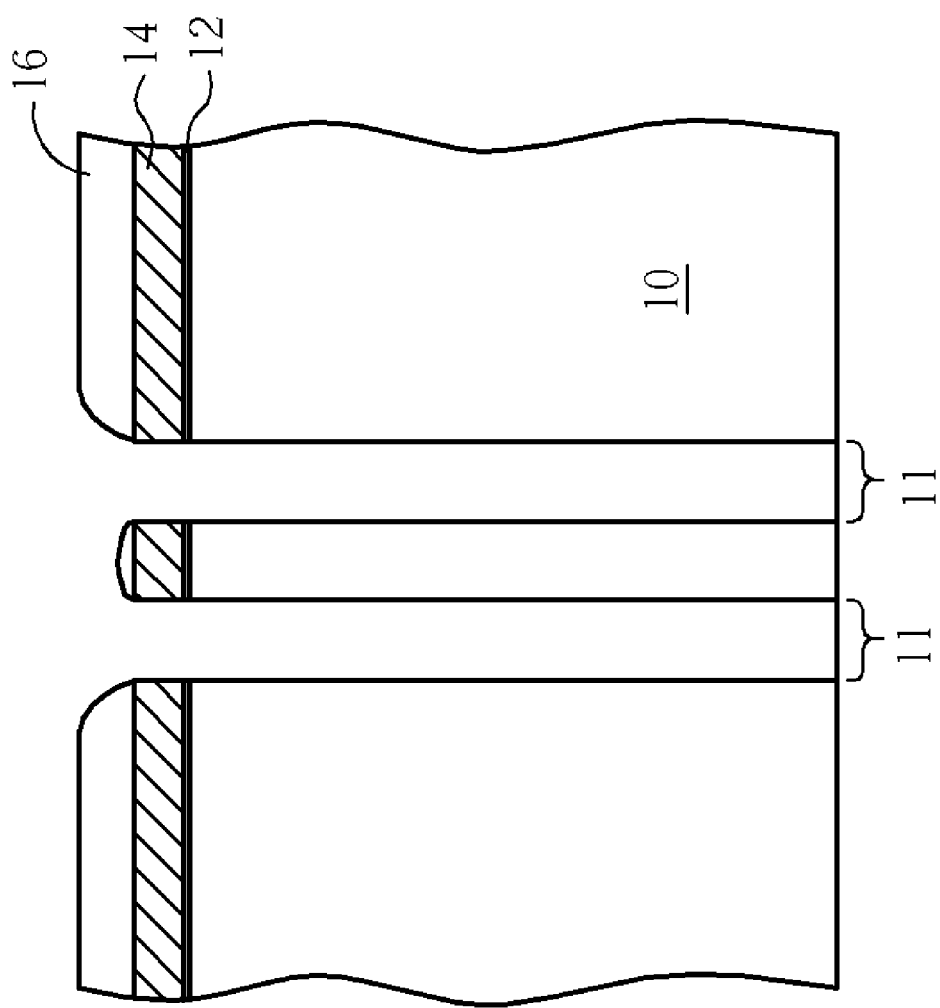
FIG. 1 to FIG. 11 are schematic cross-sectional diagrams showing the fabrication process of the trench capacitor DRAM according to the prior art.
Figure 2:
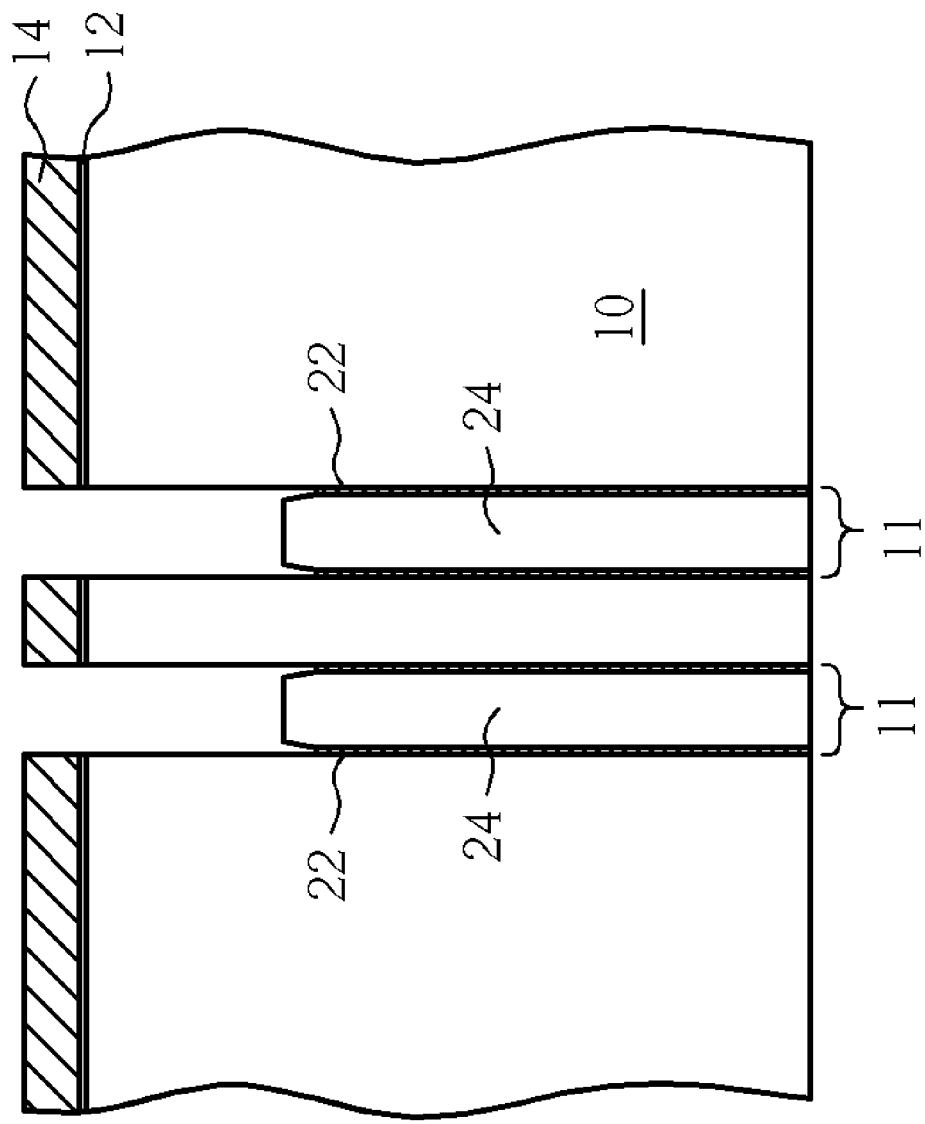
Figure 3:
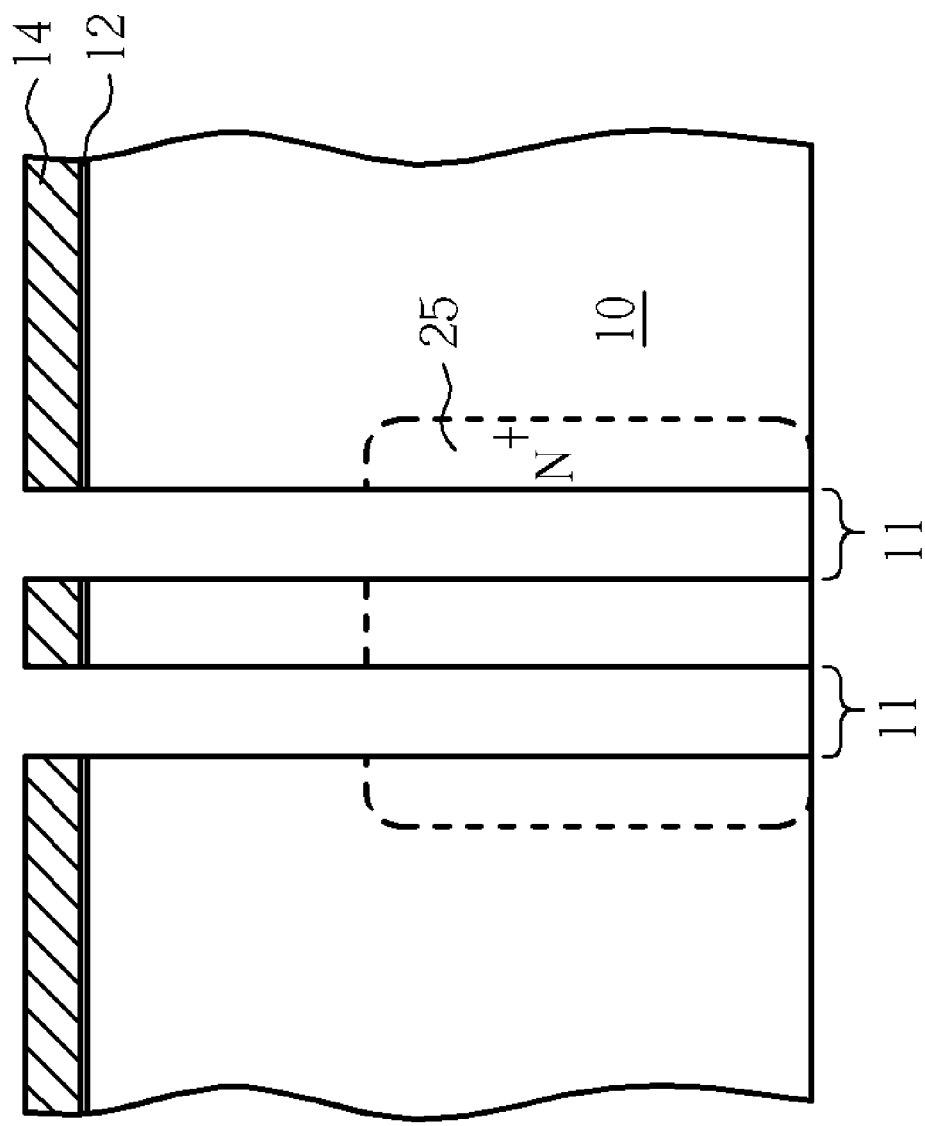
Figure 4:
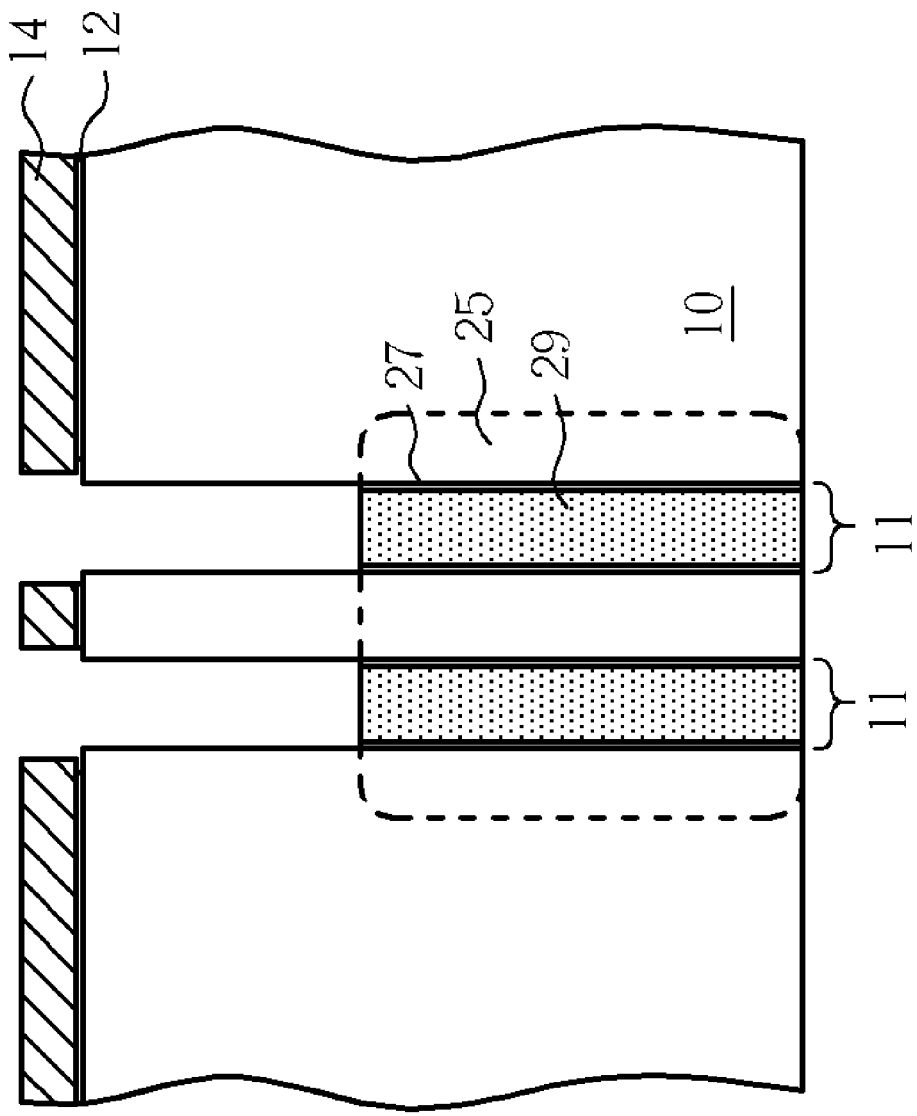
Figure 5:
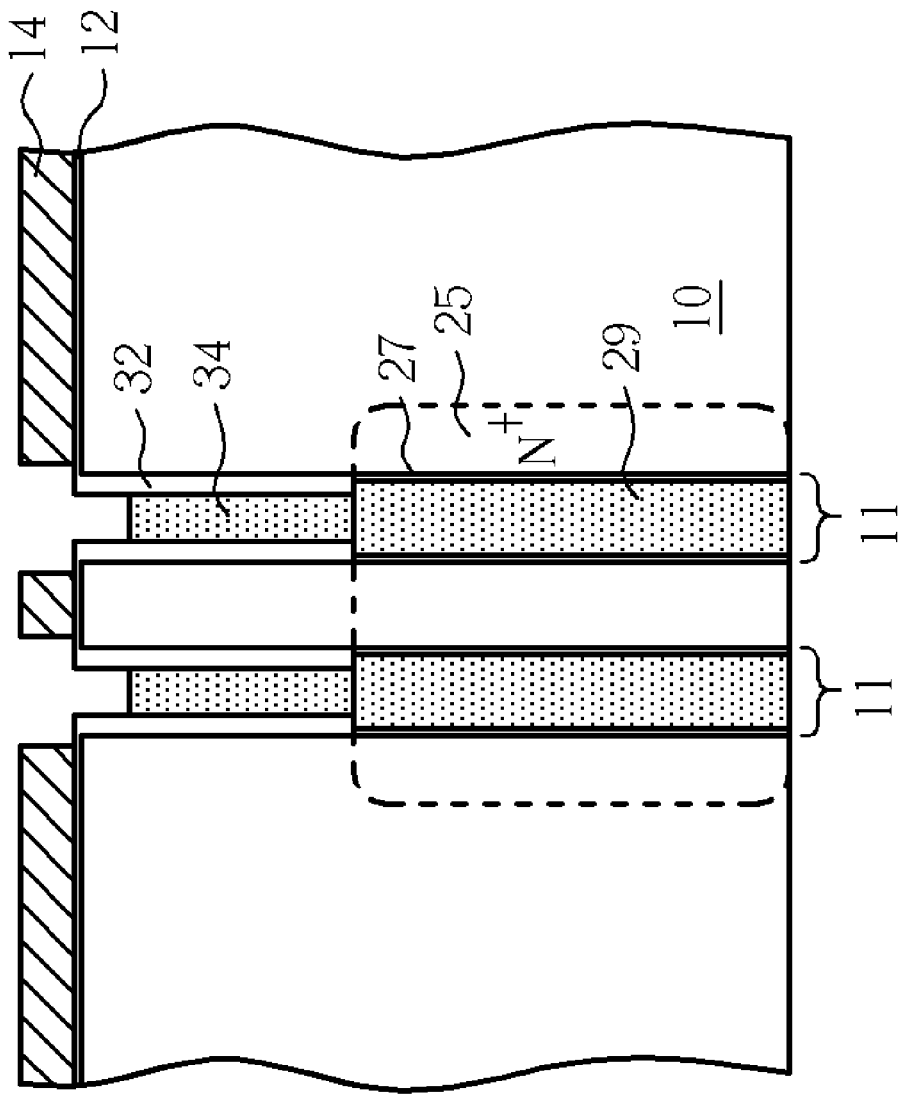
Figure 6:
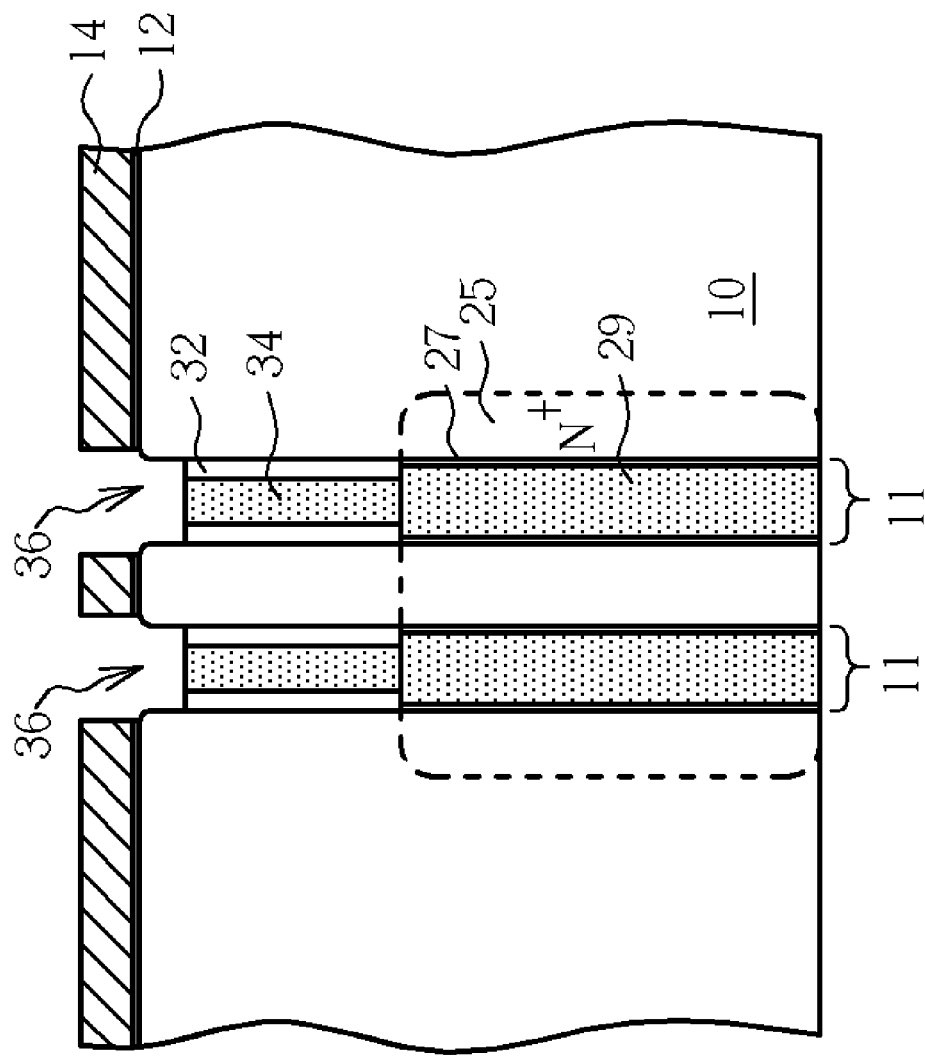
Figure 7:
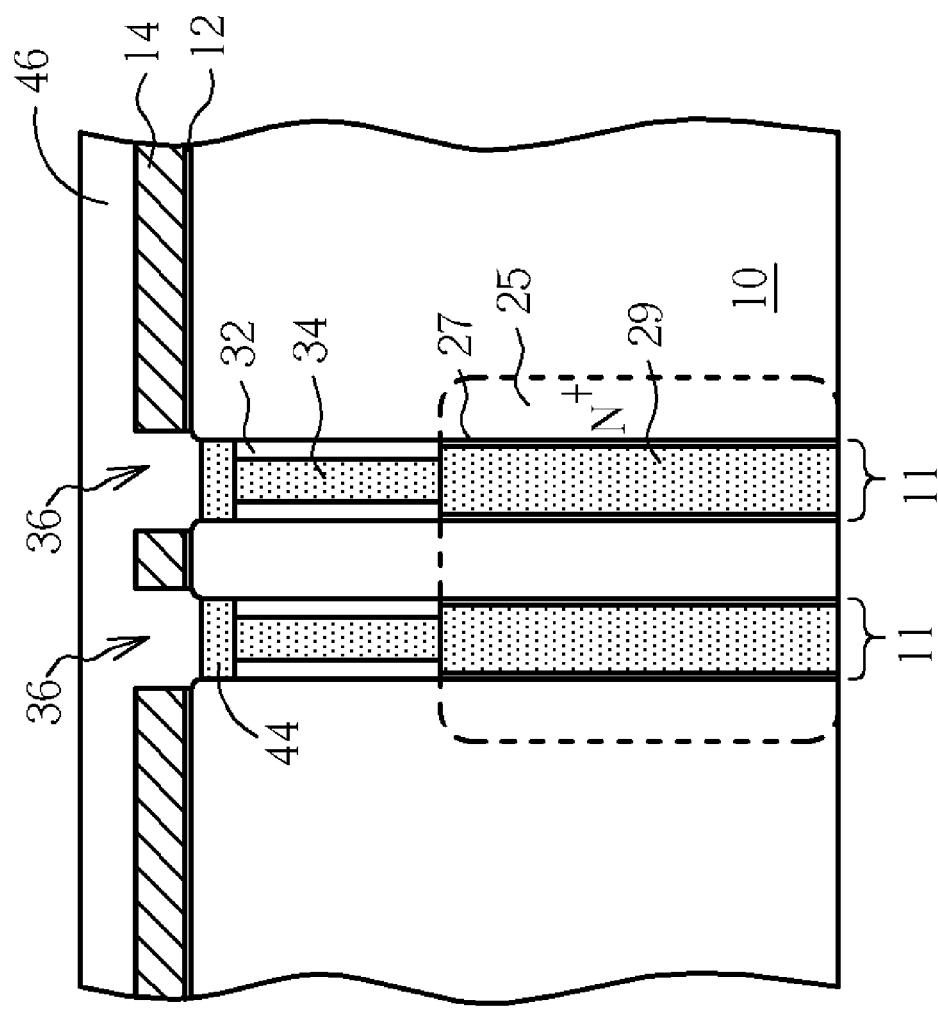
Figure 8:
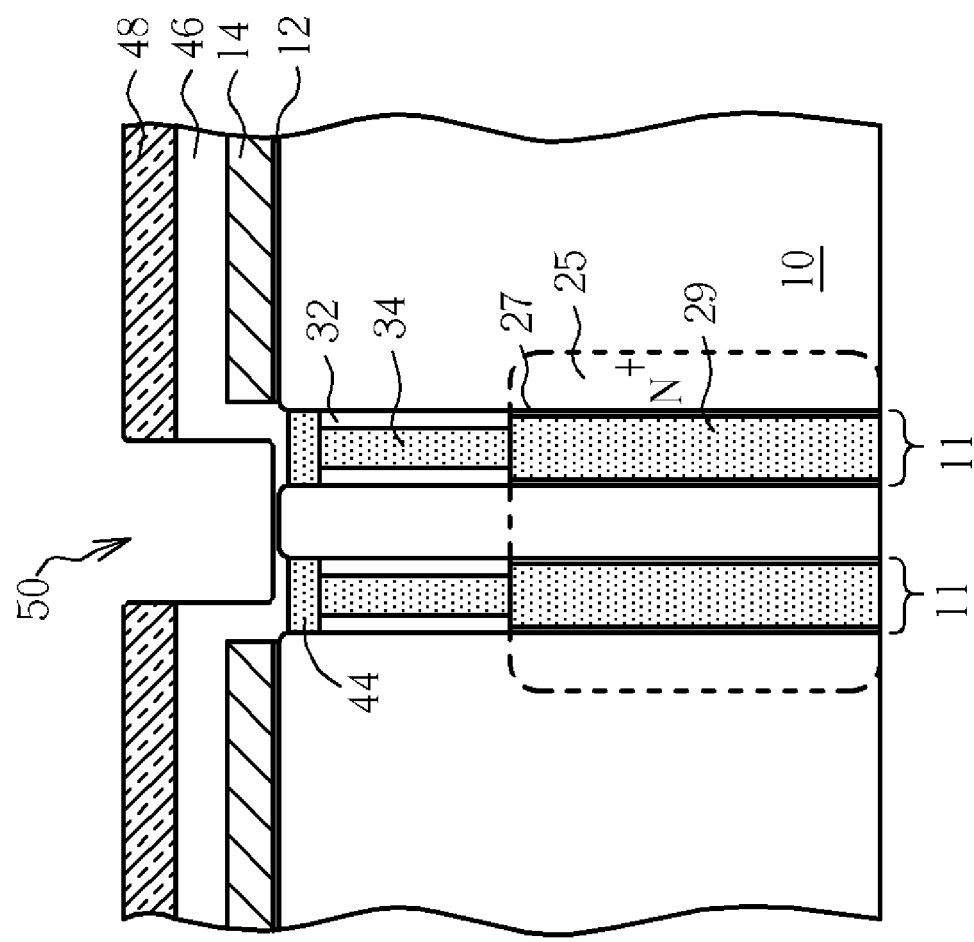
Figure 9:
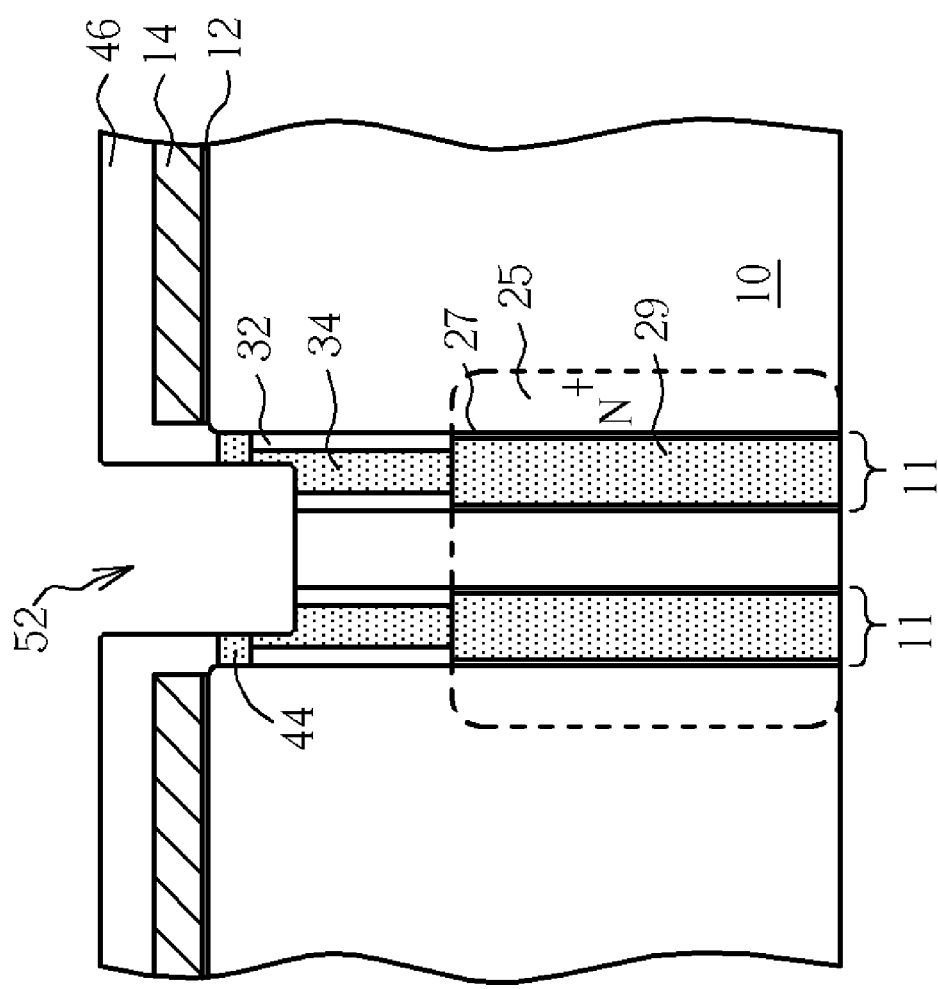
Figure 10:
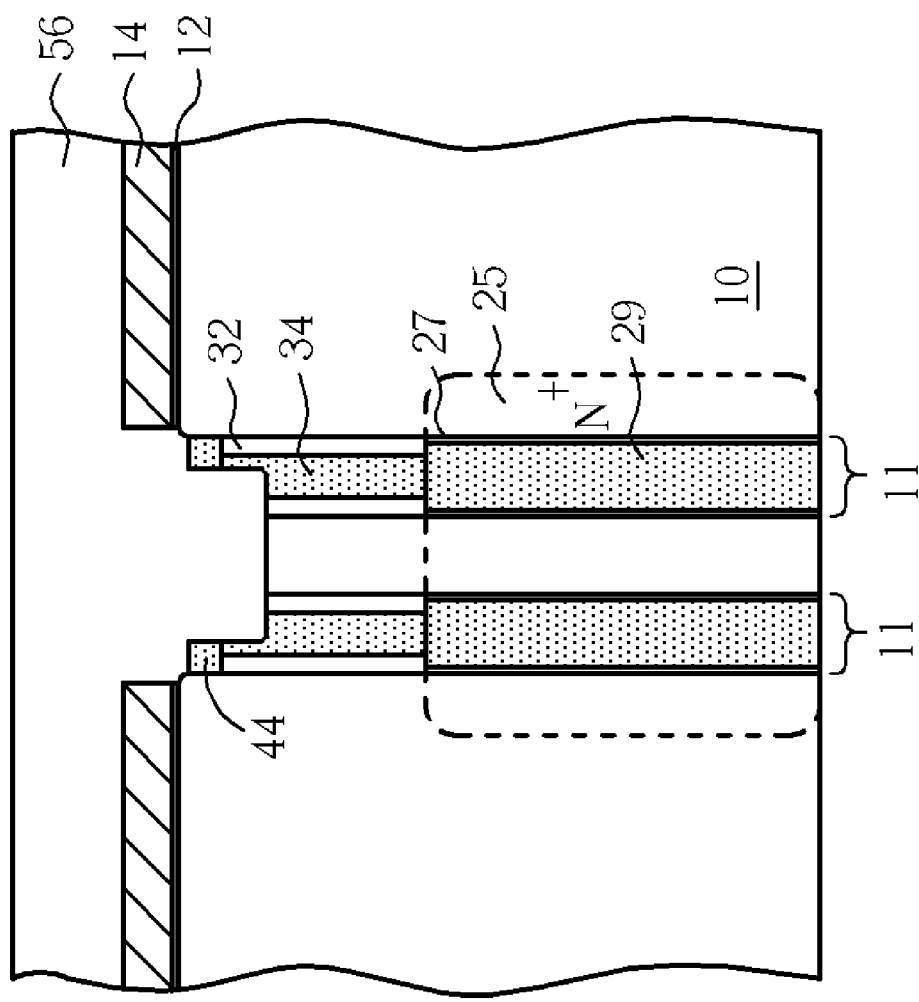
Figure 11:
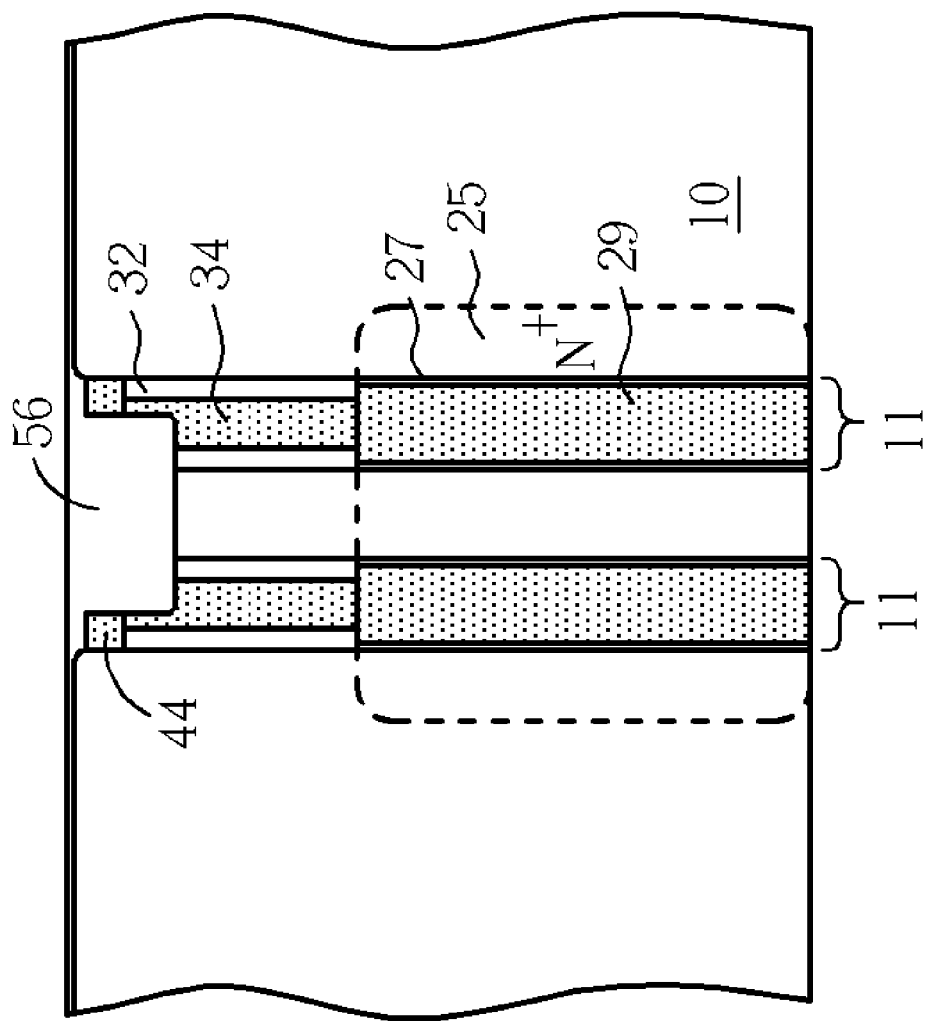
Figure 12:
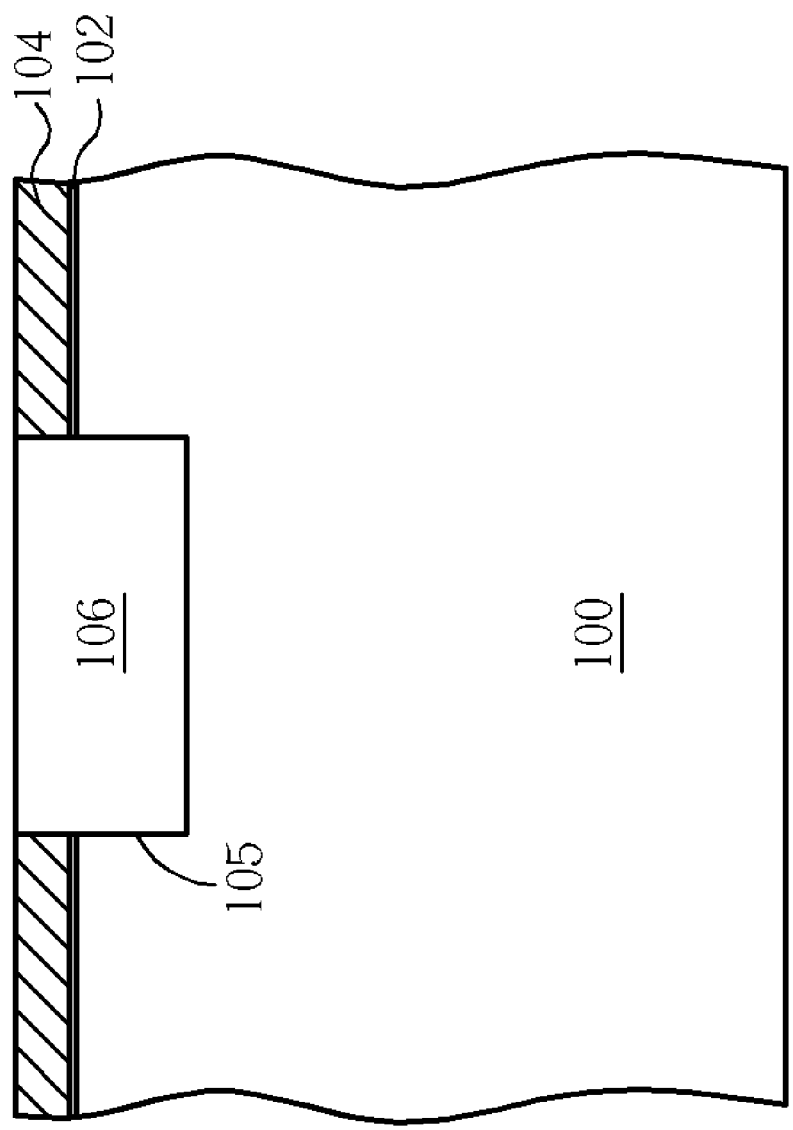
FIG. 12 to FIG. 30 are schematic cross-sectional diagrams showing the fabrication process of the trench capacitor DRAM according to the preferred embodiment of this invention.

FIGS. 12-30 illustrate the fabrication process of the trench capacitor DRAM according to the preferred embodiment of this invention. As shown in FIG. 12, a pad oxide layer 102 and a pad nitride layer 104 are formed on the main surface of the semiconductor substrate 100. A shallow trench isolation (STI) region 106 is then formed on the semiconductor substrate 100.

The STI region 106 may be formed by the steps of forming a photoresist layer (not shown) on the pad nitride layer 104, etching the pad nitride layer 104 through an opening of the photoresist layer, then using the pad nitride layer 104 as a hard mask, etching the semiconductor substrate 100 thus forming a trench 105, then filling the trench 105 with insulating material such as HDPCVD oxide, finally using the pad nitride layer 104 as a polish stop, chemical mechanically polishing the insulating material outside the trench 105.

Figure 13:
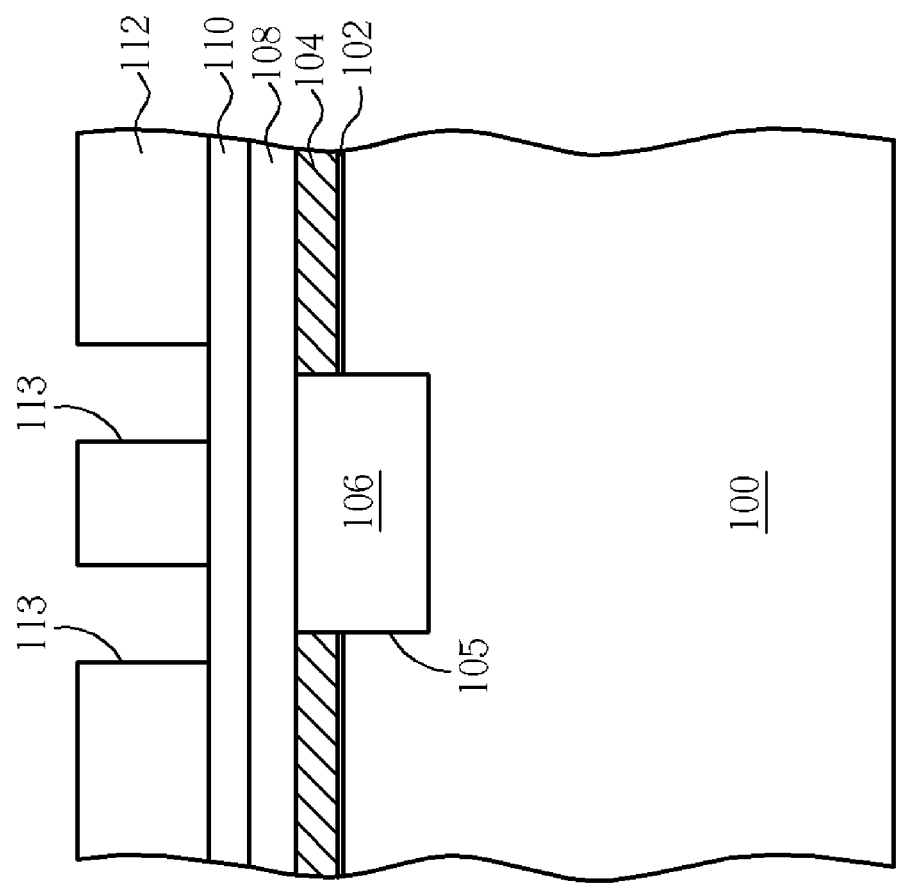

As shown in FIG. 13, a hard mask layer 108 is formed over the semiconductor substrate 100. The hard mask layer 108 covers the pad nitride layer 104 and the STI region 106. A bottom anti-reflection coating (BARC) layer 110 is then formed on the hard mask layer 108. A photoresist layer 112 is then formed on the BARC layer 110. Using conventional lithographic process, an opening 113 is defined in the photoresist layer 112. The opening 113 expose the area of deep trenches to be etched into the semiconductor substrate 100.

Figure 14:
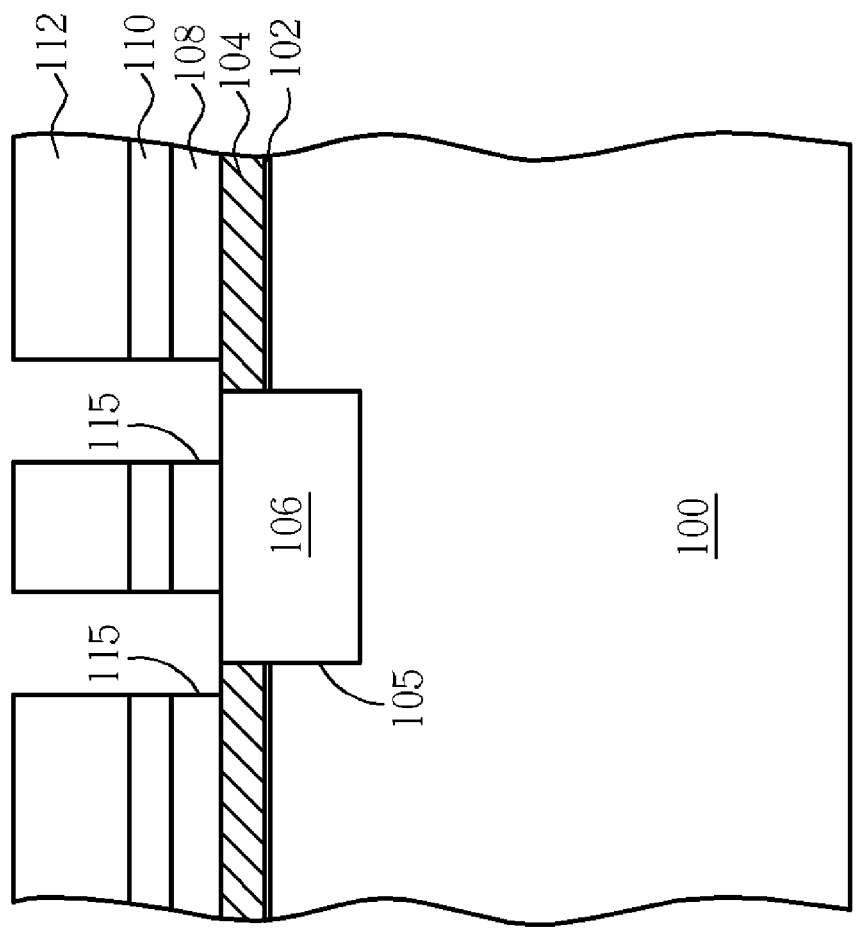

As shown in FIG. 14, using the photoresist layer 112 as an etching hard mask, a conventional dry etching process is carried out to etch the BARC layer 110 and the hard mask layer 108 through the opening 113. The opening 113 is transferred to the hard mask layer 108, forming the opening 115 in the hard mask layer 108. The opening 115 exposes a portion of the STI region 106 and a portion of the pad nitride layer 104 bordering the STI region 106.

Figure 15:
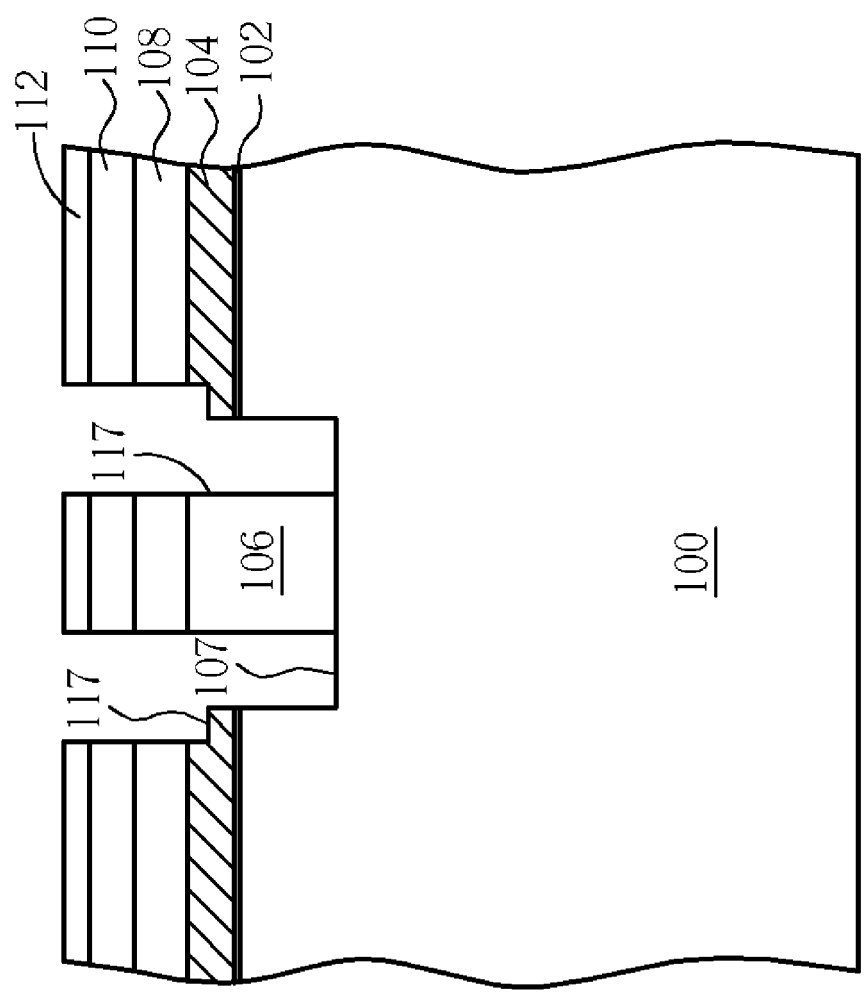

As shown in FIG. 15, through the opening 115, the exposed STI region 106 and pad nitride layer 104 are etched away to form a step recess 117. The entire thickness of the exposed STI region 106 is removed, but only a portion of the exposed pad nitride layer 104 is removed since the etching rate of the pad nitride layer 104 is smaller than the etching rate of the STI fill oxide. The dry etching of the exposed STI region 106 and pad nitride layer 104 is terminated upon reaching the bottom surface 107 of the trench 105.

Figure 16:
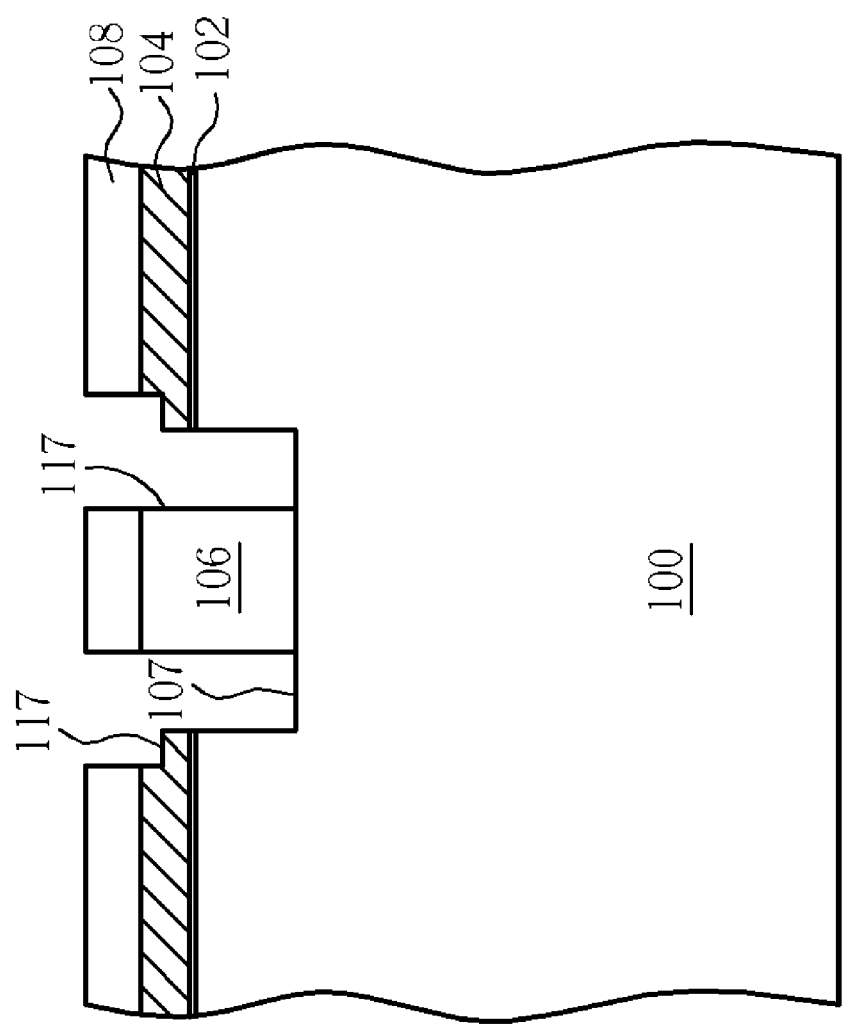

Subsequently, as shown in FIG. 16, the remaining photoresist layer 112 and the BARC layer 110 are completely removed using any suitable methods known in the art such as plasma ashing or wet etching.

Figure 17:
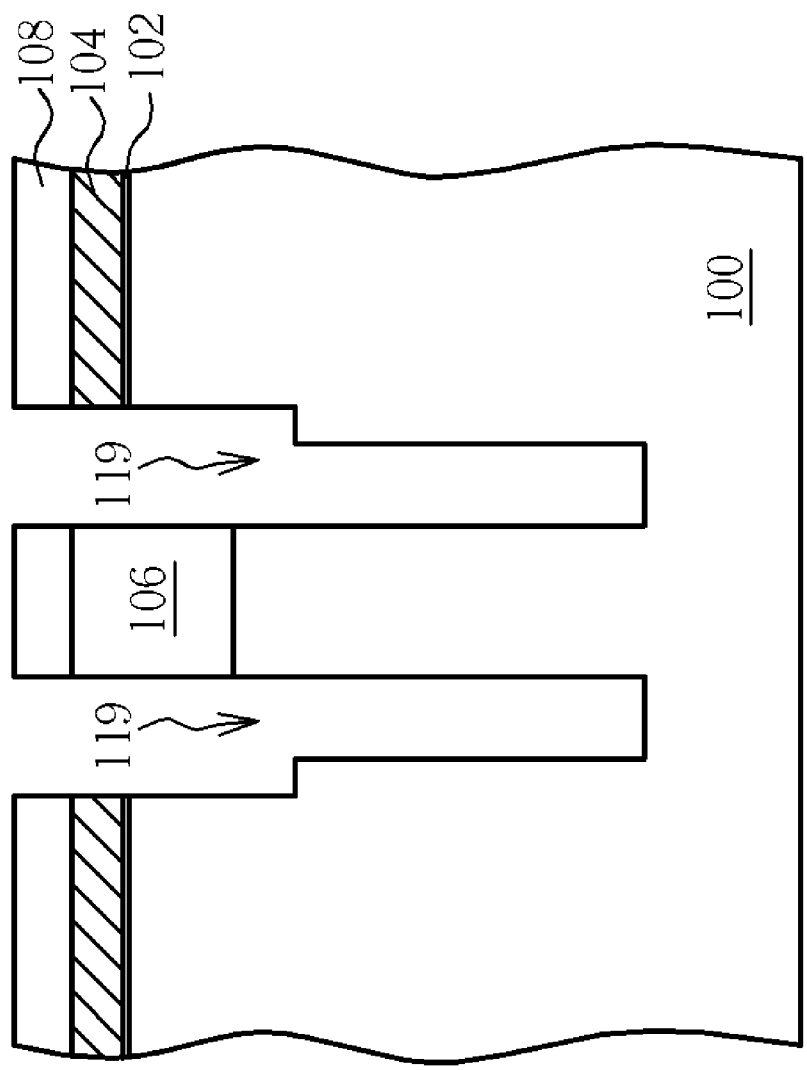

As shown in FIG. 17, using the hard mask layer 108 as an etching hard mask, another dry etching process is performed to etching the pad nitride layer 104 and the exposed semiconductor substrate 100 through the step recess 117, thereby forming a step deep trench 119.

Figure 18:
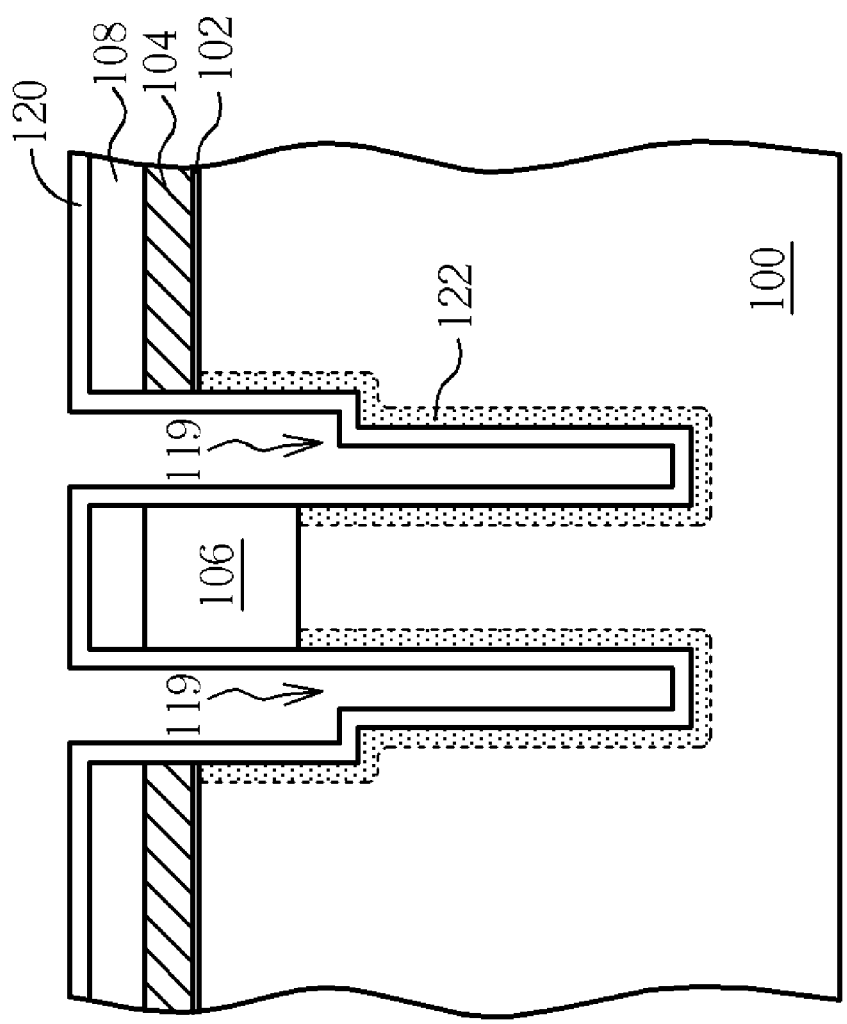

As shown in FIG. 18, after the formation of the step deep trench, a conformal layer of doped silicon glass 120 such as a phosphorus-doped silicon glass (PSG) or boron-doped silicon glass (BSG) is deposited over the semiconductor substrate 100. The doped silicon glass 120 covers the hard mask layer 108 and the interior surface of the step deep trench 119.

A thermal diffusion process is carried to make the dopants in the doped silicon glass 120 out diffuse into the semiconductor substrate 100, thereby forming a diffusion plate region 122. According to the preferred embodiment of this invention, the diffusion plate region 122 functions as a storage node electrode of the deep trench capacitor and is used to store signal charge.

Figure 19:
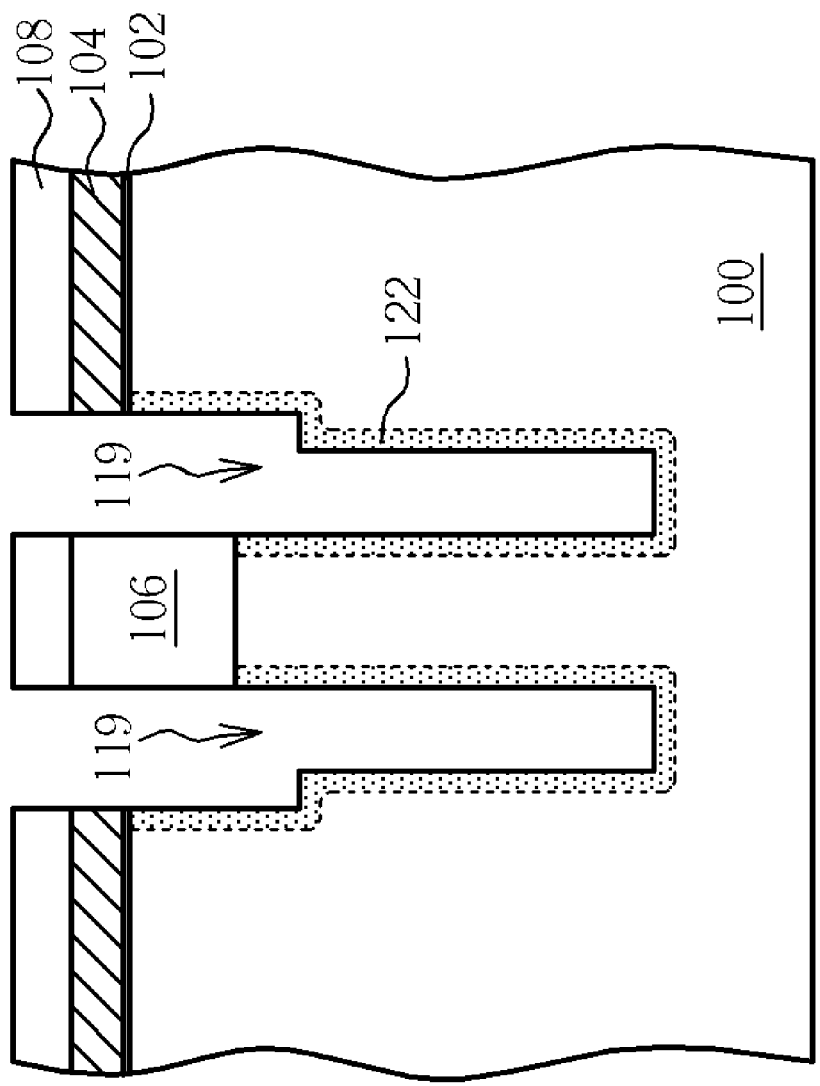

As shown in FIG. 19, after the formation of the diffusion plate region 122, the doped silicon glass 120 is removed.

Figure 20:
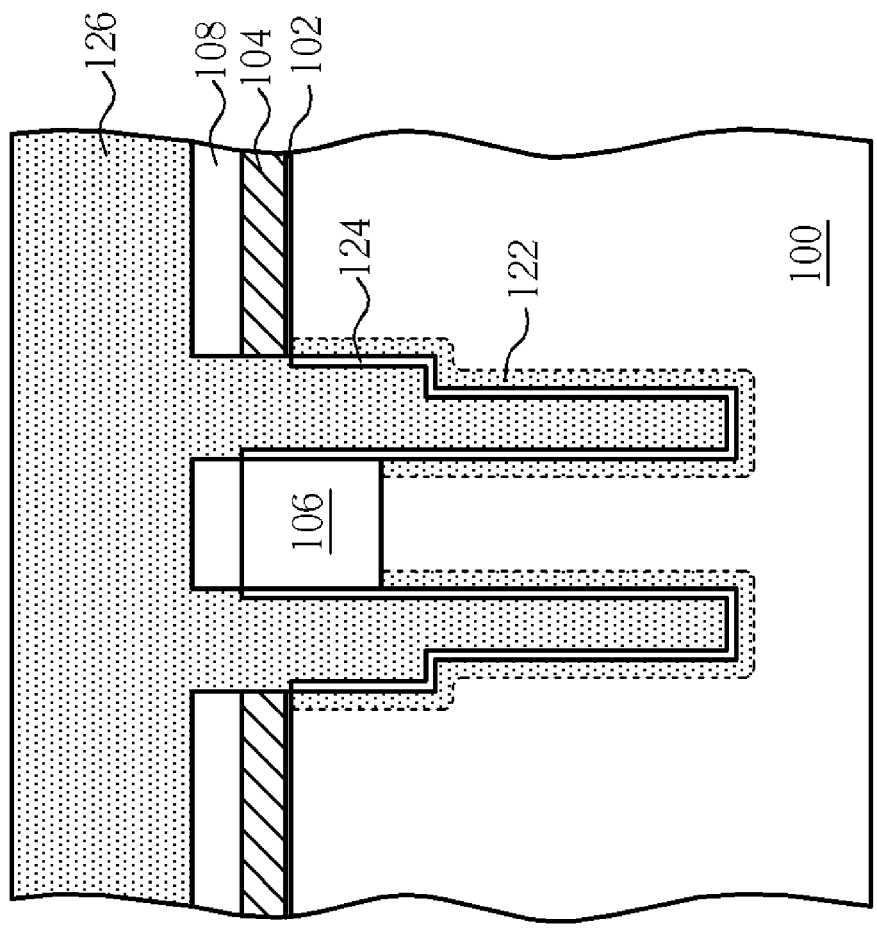

As shown in FIG. 20, a capacitor dielectric layer 124 is formed on the interior surface of the step deep trench 119. The capacitor dielectric layer 124 may be an oxide-nitride (ON) layer, an oxide-nitride-oxide (ONO) layer or other capacitor dielectric materials. After the formation of the capacitor dielectric layer 124, a doped polysilicon 126 is deposited over the semiconductor substrate 100. The step deep trench 119 is filled with the doped polysilicon 126.

Figure 21:
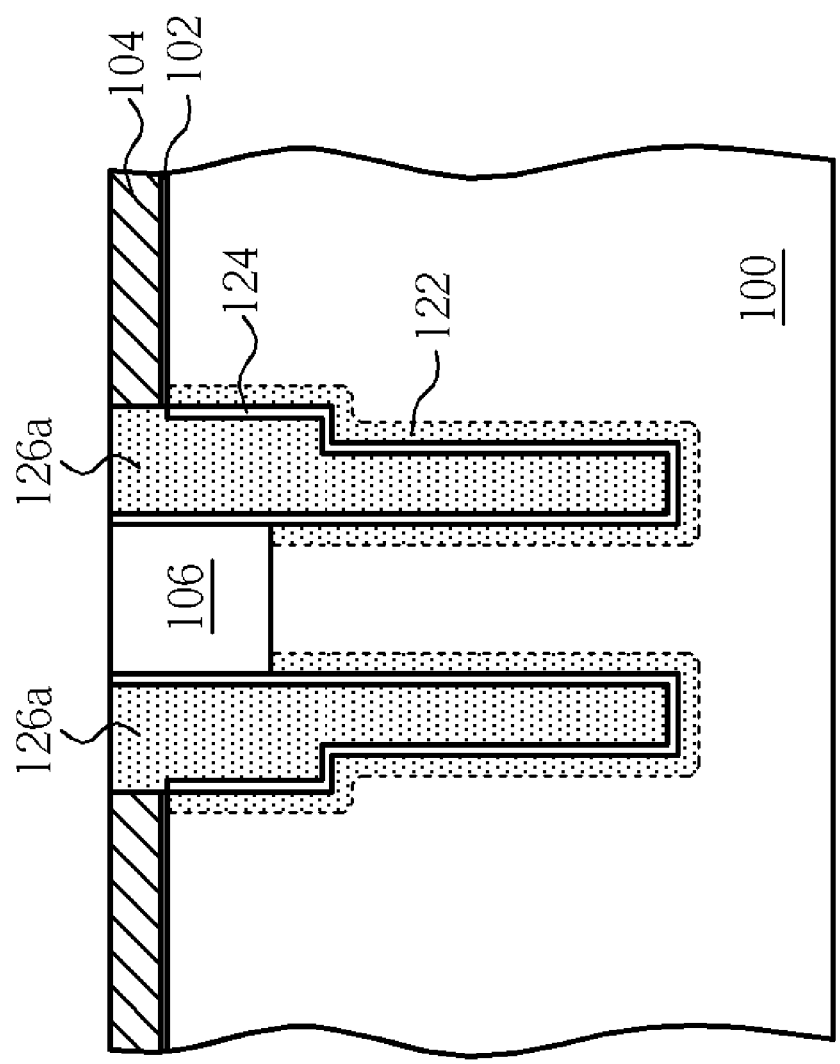

As shown in FIG. 21, using the pad nitride layer 104 as polish stop, a chemical mechanical polishing (CMP) process is performed to polish away the doped polysilicon 126 outside the step deep trench 119 and the hard mask layer 108. The remaining doped polysilicon inside the step deep trench 119 acts as a capacitor bottom electrode 126a.

Figure 22:
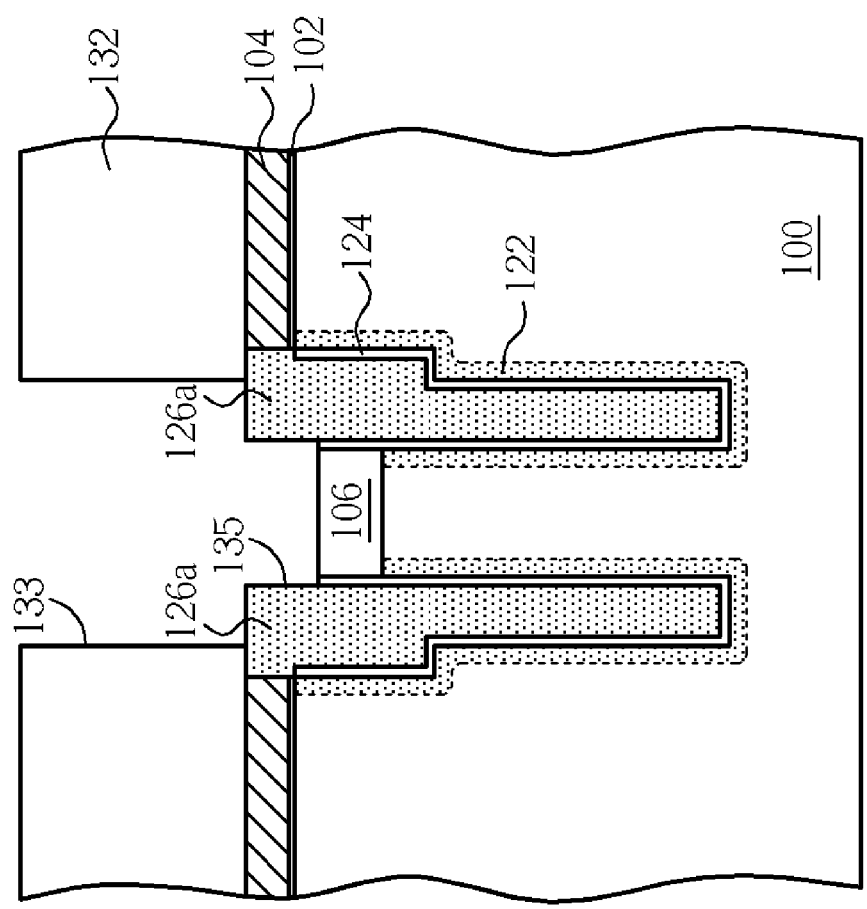

As shown in FIG. 22, a photoresist layer 132 is then formed on the semiconductor substrate 100. The photoresist layer 132 has an opening 133 that exposes the STI region 106 between the two adjacent capacitor bottom electrodes 126a. A thickness (e.g. 600-1500 angstroms) of the STI fill oxide of the exposed STI region 106 is then etched away though the opening 133. A portion of the capacitor dielectric layer 124 bordering the STI region 106 is also etched away. At this phase, the top surface of the STI region 106 is lower than the main surface of the semiconductor substrate 100, thereby forming a recess 135 between the two adjacent capacitor bottom electrodes 126a. Here, the main surface of the semiconductor substrate 100 refers to the interface between the semiconductor substrate 100 and the pad oxide layer 102. Thereafter, the photoresist layer 132 is stripped off.

Figure 23:
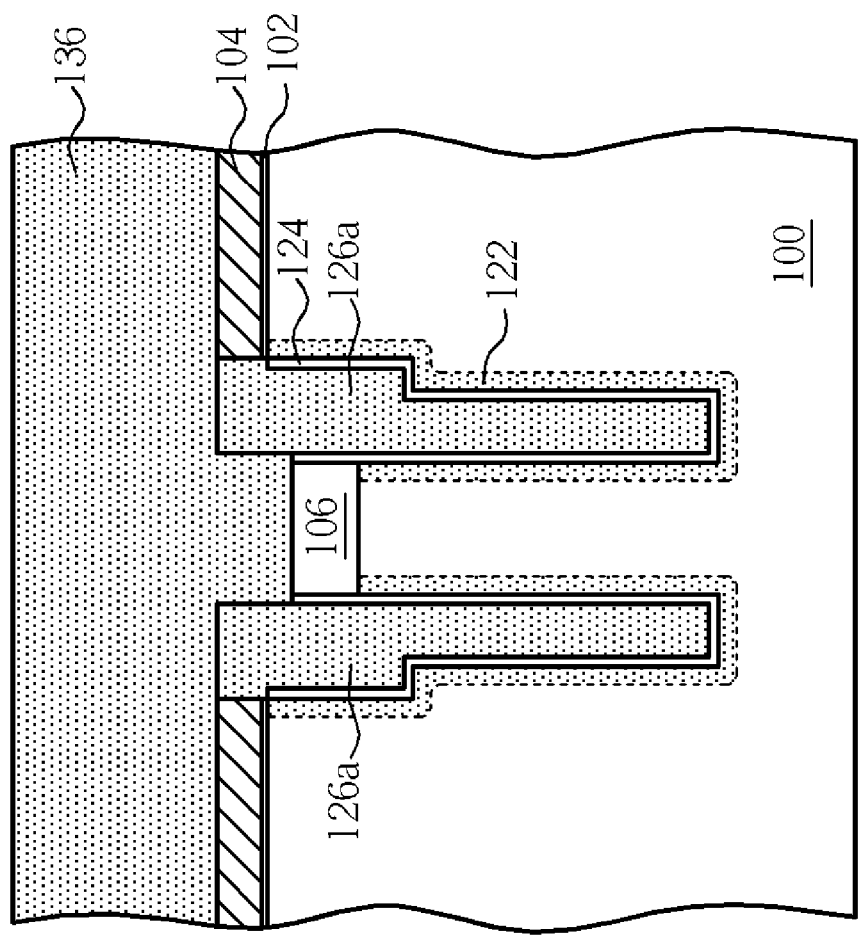

As shown in FIG. 23, a second polysilicon chemical vapor deposition (CVD) is carried out to deposit doped polysilicon 136 over the semiconductor substrate 100. The recess 135 is filled with the doped polysilicon 136.

Figure 24:
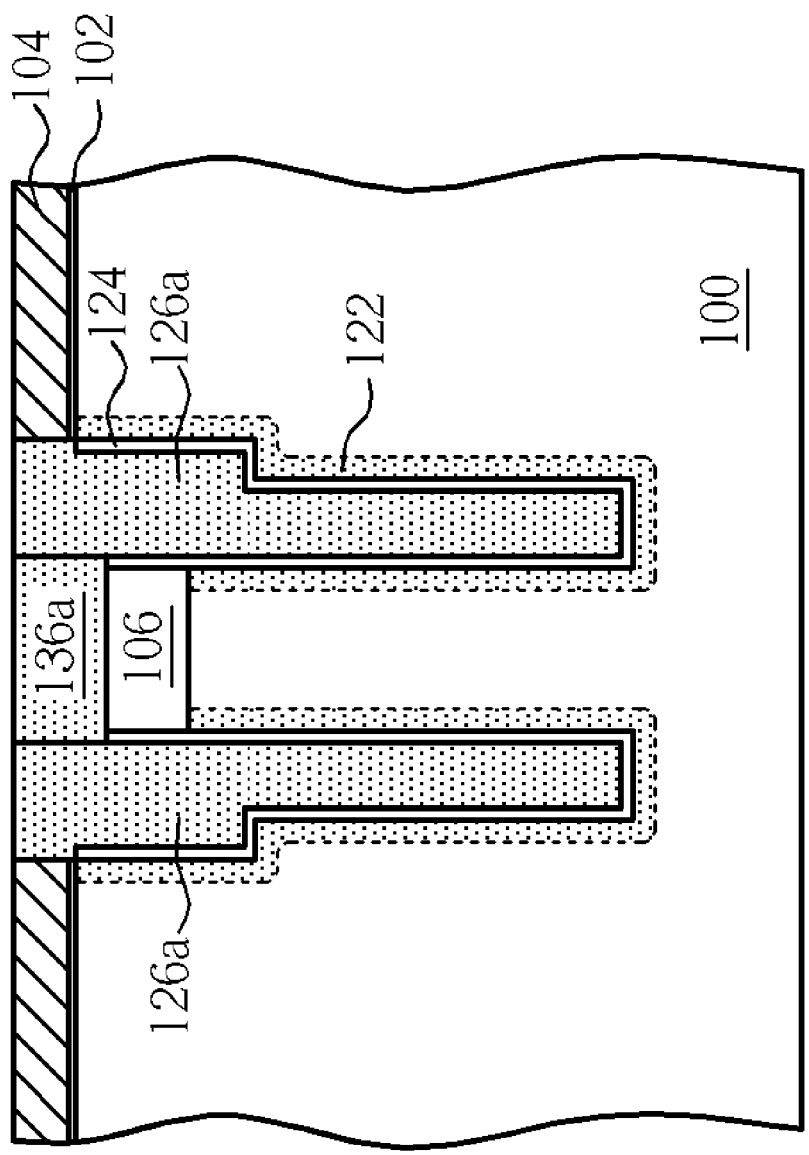

As shown in FIG. 24, using the pad nitride layer 104 as a polish stop, a second CMP process is performed to polish away the doped polysilicon 136 outside the recess 135. The remaining doped polysilicon embedded inside the recess 135 functions as a conductive strap 136a that electrically connected the two adjacent capacitor bottom electrodes 126a. After the CMP, the top surface of the capacitor bottom electrodes 126a and the top surface of the conductive strap 136a are coplanar.

Figure 25:
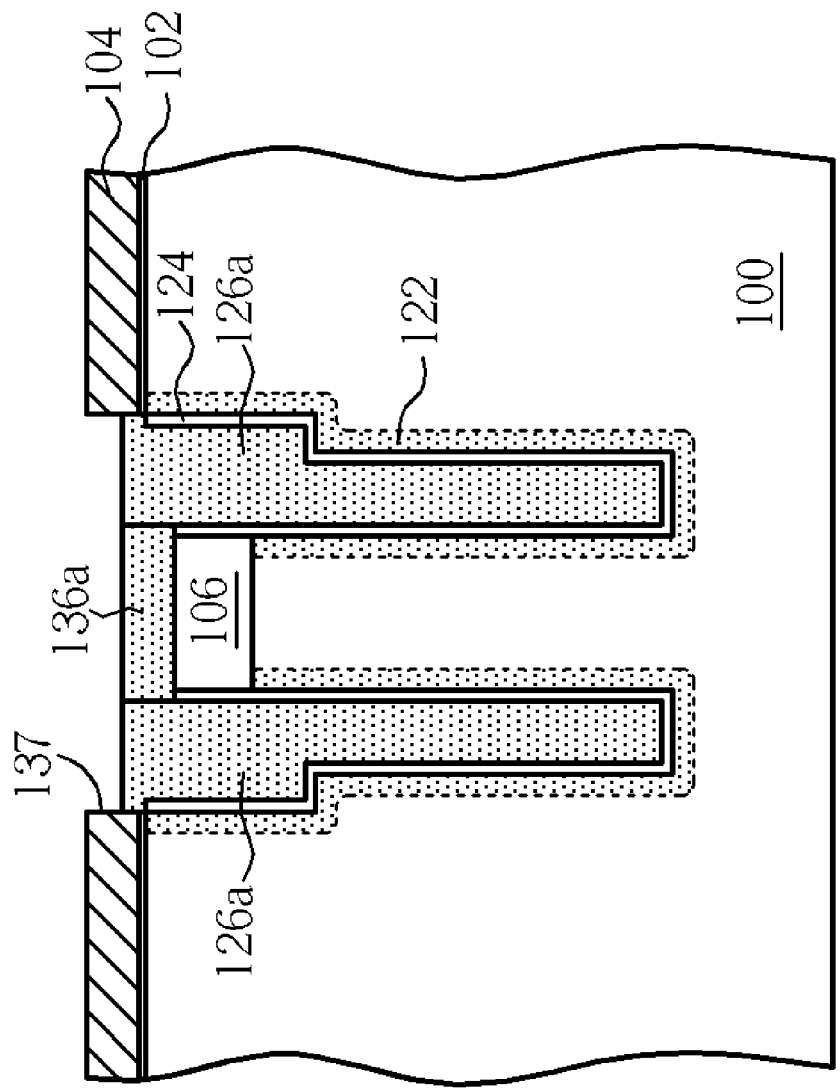

As shown in FIG. 25, using the pad nitride layer 104 as an etching hard mask, an etching process is performed to etch the coplanar top surfaces of the capacitor bottom electrodes 126a and the conductive strap 136a back to a pre-selected depth, thereby forming a recess 137. According to the preferred embodiment, the remaining thickness of the conductive strap 136a is greater than 300 angstroms.

Figure 26:
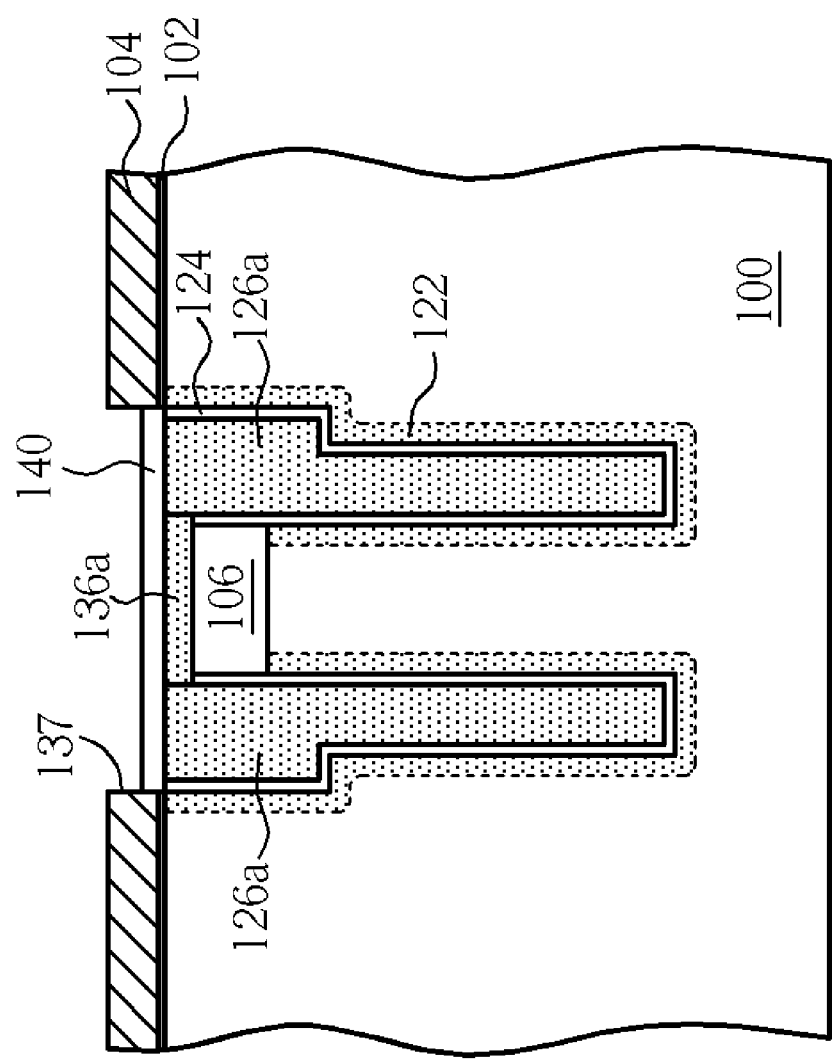

As shown in FIG. 26, the semiconductor substrate 100 is subjected to a furnace thermal oxidation process to oxidize the top surfaces of the capacitor bottom electrodes 126a and the conductive strap 136a in the recess 137, thereby forming a insulating oxide layer 140 having a thickness of no less than 100 angstroms.

In another preferred embodiment of this invention, the insulating oxide layer 140 may be formed by depositing a CVD oxide such as HDPCVD oxide on the semiconductor substrate 100, chemical mechanically polishing the CVD oxide, and then etching back the CVD oxide to a desired thickness.

Figure 27:
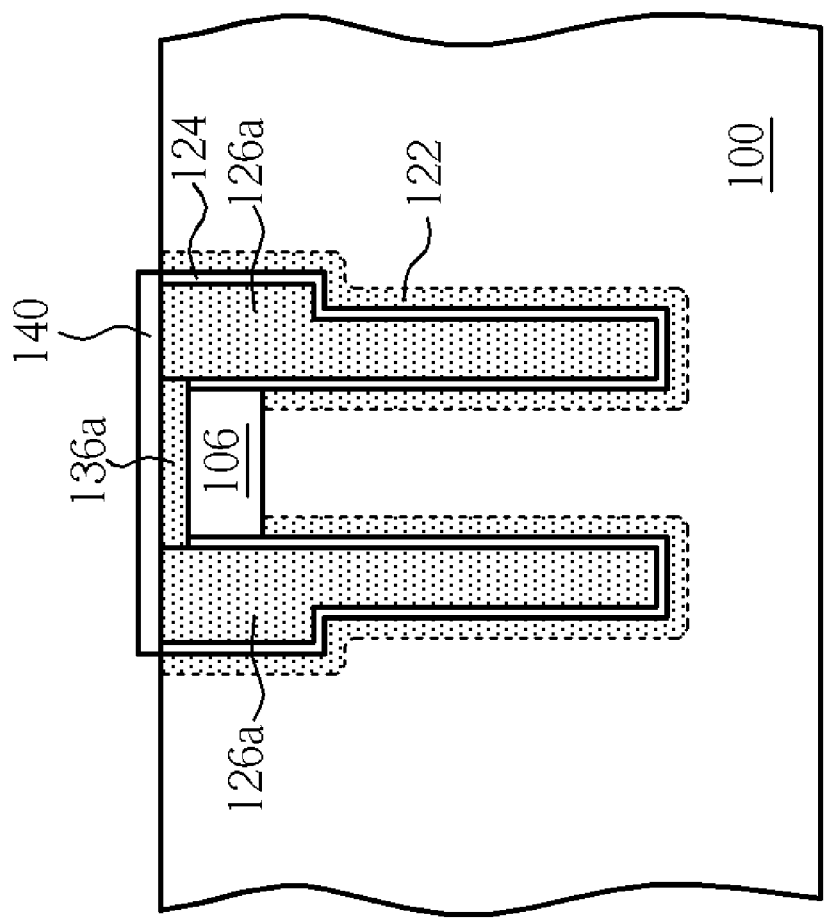

As shown in FIG. 27, after the formation of the insulating oxide layer 140, the pad nitride layer 104 and the pad oxide layer 102 are stripped off using well-known etching means such as hot phosphoric acid solution and diluted HF solution.

Figure 28:
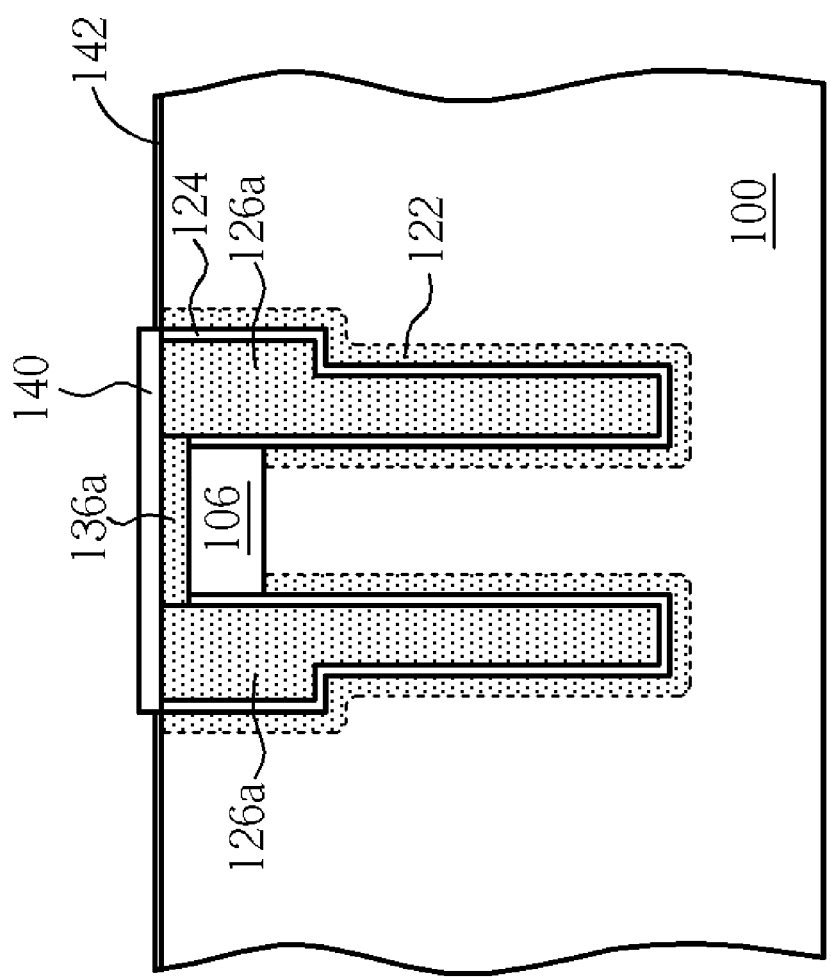

As shown in FIG. 28, the exposed main surface of the semiconductor substrate 100 is then subjected to a thermal oxidation process to grow a high-quality gate oxide film 142 thereon. The high-quality gate oxide film 142 may be formed by methods known in the art such as in-situ steam growth (ISSG). According to the preferred embodiment, the thickness of the gate oxide film 142 is between 10-50 angstroms. The present invention is further characterized in that the insulating oxide layer 140 (e.g. 100-300 angstroms) is much thicker than the gate oxide film 142 (10-50 angstroms). Since the insulating oxide layer 140 is thick, the leakage from the capacitor to the pass gates that will be disposed directly on the insulating oxide layer 140 is alleviated.

Figure 29:
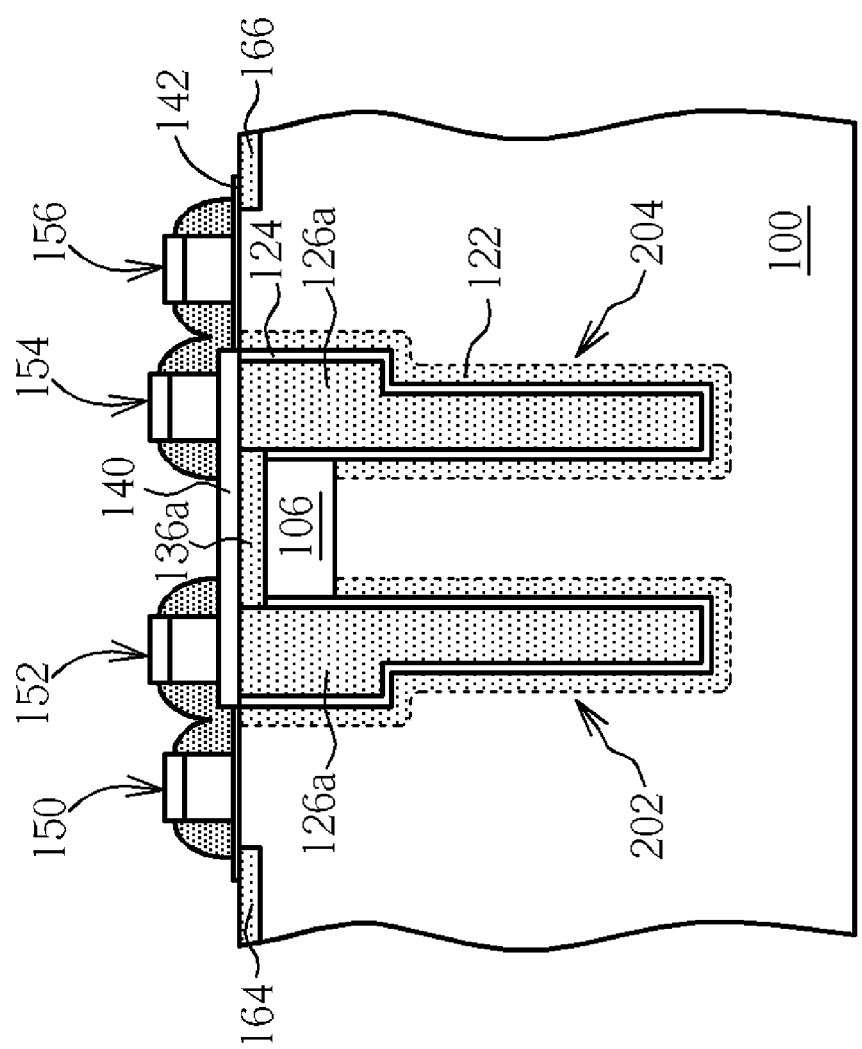

As shown in FIG. 29, standard gate process is carried out to form, on the gate oxide layer 142, a switch gate 150 and switch gate 156, and, on the insulating oxide layer 140, a pass gate 152 and pass gate 154. The pass gate 152 and pass gate 154 are disposed directly above the trench capacitors 202 and 204. The switch gate 150 is disposed next to the trench capacitors 202 and the switch gate 156 is disposed next to the trench capacitors 204.

After the formation of gates, source/drain regions 164 and 166 are implanted into the semiconductor substrate 100 next to the switch gates 150 and 156, respectively. As indicated in FIG. 29, the source/drain region 164 is situated at one side of the switch gate 150 opposite to the trench capacitor 202, while the source/drain region 166 is situated at one side of the switch gate 156 opposite to the trench capacitor 204. The source/drain regions 164 and 166 may be further silicided in order to reduce contact resistance. The above-said gates may further comprise polysiliocn layer, silicide layer, cap nitride layer and sidewall spacers.

Figure 30:
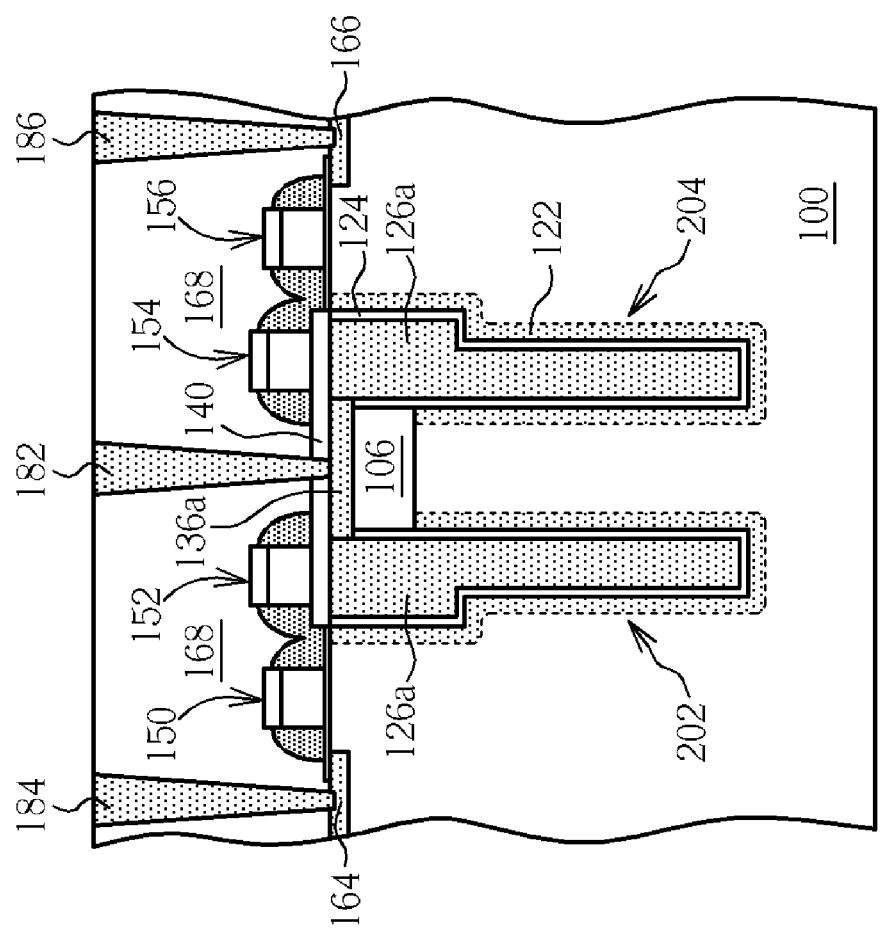

As shown in FIG. 30, a dielectric layer 168 is deposited over the semiconductor substrate 100. Thereafter, contact plugs 182, 184 and 186 are formed in the dielectric layer 168, wherein contact plug 182 penetrates the dielectric layer 168 and the insulating oxide layer 140 between the pass gates 152 and 154, then reaches the conductive strap 136a, contact plug 184 is electrically connected with the source/drain region 164, and contact plug 186 is electrically connected with the source/drain region 166.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a trench capacitor dynamic random access memory (DRAM) device, comprising:
    providing a semiconductor substrate having thereon a pad layer;
    forming an first opening in said pad layer;
    using said pad layer as an etching hard mask, dry etching said semiconductor substrate through said first opening to form a first trench;
    filling said first trench with insulating material to form a shallow trench isolation (STI) region;
    forming a mask layer over the semiconductor substrate, wherein said mask layer has at least a second opening that exposes a portion of said STI region and a portion of said pad layer;
    using said mask layer as an etching hard mask, dry etching exposed said STI region and pad layer through said second opening to form a second trench, wherein said second trench is a step trench;
    forming a trench capacitor within said second trench;
    performing a thermal oxidation process to oxidize a top portion of said trench capacitor, thereby forming an insulating oxide layer;
    stripping said pad layer to expose said semiconductor substrate;
    rowing a gate oxide layer on the exposed said semiconductor substrate; and
    forming a switch gate on said gate oxide layer, and a pass gate on said insulating oxide layer.

2. The method according to claim 1 wherein said second opening comprises two openings each of which exposing a portion of said STI region and a portion of said pad layer.

3. The method according to claim 1 wherein said insulating material is high-density plasma oxide deposited by high-density plasma chemical vapor deposition (HDPCVD) methods.

4. The method according to claim 1 wherein after filling said first trench with insulating material, the method further comprises using said pad layer as polish stop, chemical mechanically polishing said insulating material.

5. The method according to claim 1 wherein the step of forming a trench capacitor within said second trench further comprises:
    forming a diffusion plate on interior surface of said second trench;
    forming a capacitor dielectric layer on said diffusion plate; and
    forming a capacitor electrode on said capacitor dielectric layer.

6. The method according to claim 5 wherein the step of forming a diffusion plate on interior surface of said second trench further comprises:
    depositing a doped silicon glass on said interior surface of said second trench; and
    thermally drive in dopants of said doped silicon glass into said interior surface of said second trench to form said diffusion plate.

7. The method according to claim 6 wherein said doped silicon glass comprises phosphorus-doped silicon glass (PSG) and boron-doped silicon glass (BSG).

8. The method according to claim 1 wherein said pad layer comprises pad oxide layer and pad nitride layer.

9. The method according to claim 1 wherein when using said mask layer as an etching hard mask, dry etching exposed said STI region and pad layer through said second opening to form a second trench, etching rate of said pad layer is smaller than etching rate of said STI region.

10. The method according to claim 1 wherein said insulating oxide layer is thicker than said gate oxide layer.

11. The method according to claim 1 wherein said insulating oxide layer has a thickness of no less than 100 angstroms.

12. The method according to claim 1 wherein said gate oxide layer has a thickness of about 10-50 angstroms.

13. A method of fabricating a trench capacitor dynamic random access memory (DRAM) device, comprising:
    providing a semiconductor substrate having thereon a pad layer;
    forming an first opening in said pad layer;
    using said pad layer as an etching hard mask, dry etching said semiconductor substrate through said first opening to form a first trench;
    filling said first trench with insulating material to form a shallow trench isolation (STI) region;
    forming a mask layer over the semiconductor substrate, wherein said mask layer has a second opening that exposes a portion of said STI region and a portion of said pad layer;
    using said mask layer as an etching hard mask, dry etching exposed said STI region and pad layer through said second opening to form a second trench;

forming a trench capacitor within said second trench, wherein said trench capacitor comprises a diffusion plate formed on interior surface of said second trench, a capacitor dielectric layer on said diffusion plate, and a doped polysilicon capacitor electrode on said capacitor dielectric layer;

forming a conductive strap on said STI region, said conductive strap being electrically connected to said doped polysilicon capacitor electrode;

simultaneously oxidizing said doped polysilicon capacitor electrode and said conductive strap to form an insulating oxide layer;

stripping said pad layer to expose said semiconductor substrate;

growing a gate oxide layer on the exposed said semiconductor substrate; and forming a switch gate on said gate oxide layer, and a pass gate on said insulating oxide layer.

14. The method according to claim 13 wherein after forming said switch gate and pass gate, the method further comprises:

implanting source/drain region into said semiconductor substrate next to said switch gate;

depositing a dielectric layer over said semiconductor substrate; and forming a first contact plug electrically connected to said conductive strap and second contact plug electrically connected to said source/drain region, wherein said first contact plug penetrates said dielectric layer and said insulating oxide layer.

15. The method according to claim 13 wherein said insulating material is high-density plasma oxide deposited by high-density plasma chemical vapor deposition (HD-PCVD) methods.

16. The method according to claim 13 wherein after filling said first trench with insulating material, the method further comprises using said pad layer as polish stop, chemical mechanically polishing said insulating material.

17. The method according to claim 13 wherein said pad layer comprises pad oxide layer and pad nitride layer.

18. The method according to claim 13 wherein when using said mask layer as an etching hard mask, dry etching exposed said STI region and pad layer through said second opening to form a second trench, etching rate of said pad layer is smaller than etching rate of said STI region.

19. The method according to claim 13 wherein said second trench is a step trench.

20. The method according to claim 13 wherein said insulating oxide layer has a thickness of no less than 100 angstroms, and said gate oxide layer has a thickness of about 10-50 angstroms.

* * * * *